(12) United States Patent
Aisenbrey

(10) Patent No.: US 7,273,135 B2
(45) Date of Patent: Sep. 25, 2007

(54) LOW COST MAGNETIC BRAKES AND MOTION CONTROL DEVICES MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 107 days.

(21) Appl. No.: 11/121,666

(22) Filed: May 4, 2005

(65) Prior Publication Data

US 2005/0205712 A1 Sep. 22, 2005

Related U.S. Application Data

(63) Continuation-in-part of application No. 10/877,092, filed on Jun. 25, 2004, which is a continuation of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/569,515, filed on May 6, 2004, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*F16F 15/03* (2006.01)

(52) U.S. Cl. .................................... 188/164; 188/267

(58) Field of Classification Search ............... 188/267, 188/158, 160, 162, 164; 318/362–382; 310/92
See application file for complete search history.

(56) References Cited

U.S. PATENT DOCUMENTS 4,434,951 A * 3/1984 Nakajima ................... 242/288

(Continued)

FOREIGN PATENT DOCUMENTS

GB 377449 A 1/2003

OTHER PUBLICATIONS

Co-pending U.S. Appl. No. 11/121,667, filed May 4, 2005, Low Cost Magnetic Brakes and Motion Control Devices Manufactured From Conductive Loaded Resin-Based Materials, assigned to the same assignee.

*Primary Examiner*—Christopher P. Schwartz
(74) *Attorney, Agent, or Firm*—Douglas R. Schnabel

(57) ABSTRACT

Magnetic brake components are formed of a conductive loaded resin-based material. The conductive loaded resin-based material comprises micron conductive powder(s), conductive fiber(s), or a combination of conductive powder and conductive fibers in a base resin host. The percentage by weight of the conductive powder(s), conductive fiber(s), or a combination thereof is between about 20% and 50% of the weight of the conductive loaded resin-based material. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, aluminum fiber, or the like.

24 Claims, 6 Drawing Sheets

U.S. PATENT DOCUMENTS

| | | | | |
|---|---|---|---|---|
| 4,544,111 A | * | 10/1985 | Nakajima | 242/288 |
| 4,561,605 A | * | 12/1985 | Nakajima | 242/288 |
| 5,006,045 A | * | 4/1991 | Shimoda et al. | 417/42 |
| 5,581,139 A | * | 12/1996 | Toukola | 310/105 |
| 5,749,534 A | * | 5/1998 | Morimoto | 242/288 |
| 5,804,897 A | * | 9/1998 | Kuwahara | 310/77 |
| 5,861,695 A | | 1/1999 | Brassard | 310/154 |
| 6,031,309 A | * | 2/2000 | Nishimura | 310/92 |
| 6,062,350 A | | 5/2000 | Spieldiener et al. | 188/161 |
| 6,246,035 B1 | * | 6/2001 | Okuda | 219/619 |
| 6,412,611 B1 | | 7/2002 | Pribonic | 188/165 |
| 6,648,108 B2 | * | 11/2003 | Grupp et al. | 188/165 |
| 2002/0047316 A1 | * | 4/2002 | Chitayat | 310/12 |
| 2002/0097127 A1 | * | 7/2002 | Fujiwara et al. | 336/178 |
| 2002/0149272 A1 | * | 10/2002 | Chitayat | 310/12 |
| 2002/0167869 A1 | * | 11/2002 | Masuda et al. | 368/238 |
| 2003/0001446 A1 | * | 1/2003 | Hasegawa et al. | 310/90.5 |
| 2003/0003307 A1 | * | 1/2003 | Tsuchida et al. | 428/413 |
| 2003/0005563 A1 | * | 1/2003 | Tamai et al. | 29/426.1 |
| 2003/0127157 A1 | * | 7/2003 | Iyoda et al. | 148/104 |

* cited by examiner

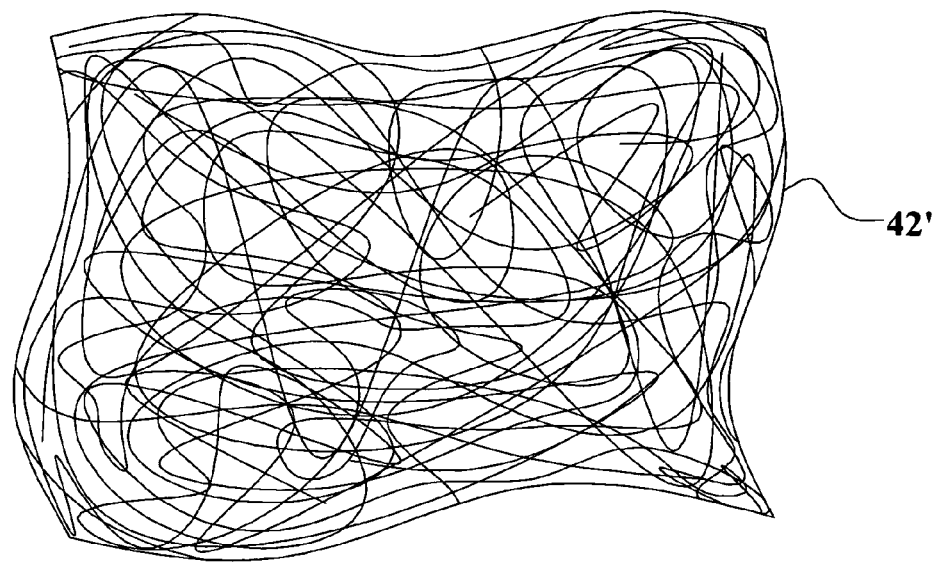
FIG. 5b
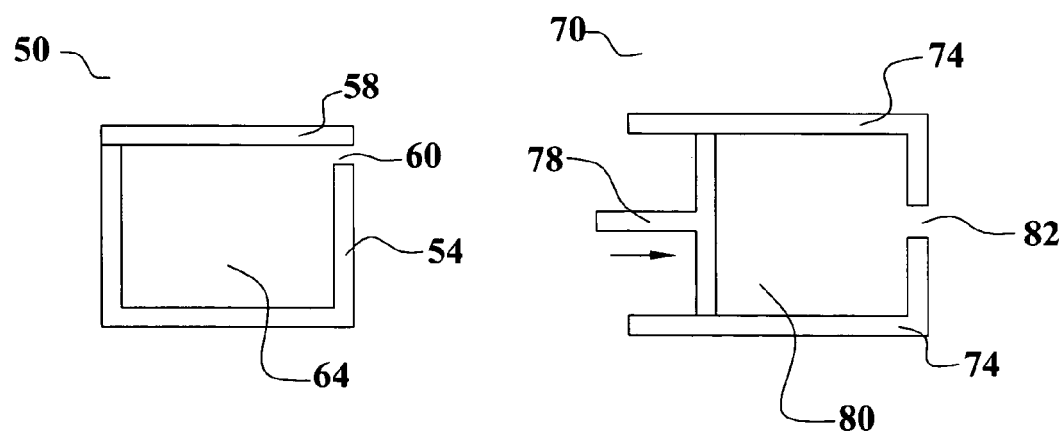
FIG. 6a  FIG. 6b

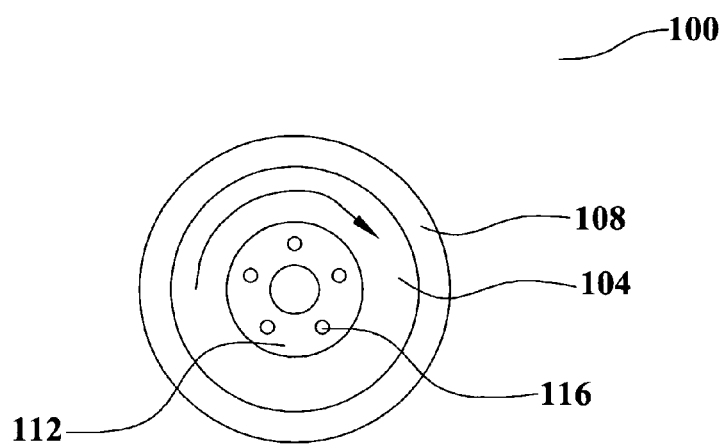
FIG. 7a
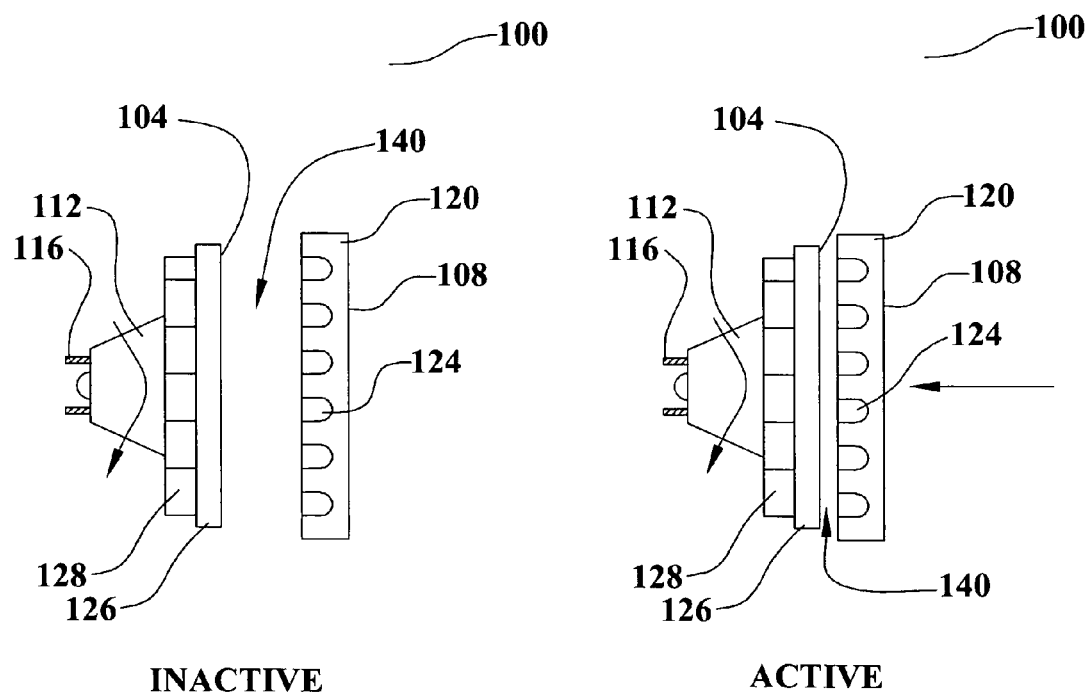
INACTIVE
FIG. 7b
ACTIVE
FIG. 7c

LOW COST MAGNETIC BRAKES AND MOTION CONTROL DEVICES MANUFACTURED FROM CONDUCTIVE LOADED RESIN-BASED MATERIALS

RELATED PATENT APPLICATIONS

This patent application is related to U.S. patent application Ser. No. INT04-004B, Ser. No. 11/121,667, and filed on May 4, 2005, which is herein incorporated by reference in its entirety.

This patent application claims priority to the U.S. Provisional Patent Application 60/569,515, filed on May 6, 2004, which is herein incorporated by reference in its entirety.

This patent application is a Continuation-in-Part of INT01-002CIPC, filed as U.S. patent application Ser. No. 10/877,092, filed on Jun. 25, 2004, which is a Continuation of INT01-002CIP, filed as U.S. patent application Ser. No. 10/309,429, filed on Dec. 4, 2002, now issued as U.S. Pat. No. 6,870,516, also incorporated by reference in its entirety, filed as U.S. patent application Ser. No. 10/075,778, filed on Feb. 14, 2002, now issued as U.S. Pat. No. 6,741,221, which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001, all of which are incorporated by reference in their entirety.

BACKGROUND OF THE INVENTION (1) Field of the Invention

This invention relates to magnetic brakes and, more particularly, to magnetic brake components molded of conductive loaded resin-based materials comprising micron conductive powders, micron conductive fibers, or a combination thereof, substantially homogenized within a base resin when molded. This manufacturing process yields a conductive part or material usable within the EMF or electronic spectrum(s).

(2) Description of the Prior Art

Magnetic braking devices are useful in a variety of applications where smooth and automatic decelerations are desired. Amusement park rides, mass transportation, manufacturing conveyors, and computer controlled machining are just a few examples of applications for magnetic brakes. When a conductor moves through a magnetic field, an Eddy current can be induced in that conductor. The direction of the Eddy current flow will then generate a secondary magnetic field such that an opposing electromotive force (EMF) is generated. This EMF will oppose the movement of the conductor through the magnetic field. This braking technique allows a moving object to be slowed by a passive force, such as a permanent magnet, and by the very inertia of the object's movement. Magnetic braking devices are inherently reliable, quiet, and smooth. Typically, these devices are formed using a permanent magnet, or an array of permanent magnets, and using a conductive fin. It is a primary object of the present invention to provide components for a magnetic brake device.

Several prior art inventions relate to magnetic braking devices. U.S. Pat. No. 6,412,611 B1 to Pribonic teaches an eddy current braking system. A conductive fin for the magnetic brake further comprises a friction layer to provide a mechanical braking capability. U.S. Pat. No. 6,062,350 to Spieldiener et al teaches a magnetic braking system for an amusement park ride. The conductor rail comprises a carrier structure with conductive coatings of differing conductivities to thereby optimize the magnetic braking performance. U.S. Pat. No. 6,648,108 B2 to Grupp et al describes a magnetic track brake and an eddy current brake. U.S. Pat. No. 5,861,695 to Brassard describes an electrical rotary machine having a magnet comprising a ferromagnetic material dispersed in a non-magnetic matrix, such as a resin.

SUMMARY OF THE INVENTION

A principal object of the present invention is to provide effective magnetic brake components.

A further object of the present invention is to provide a conductive fin for a magnetic brake from conductive loaded resin-based material.

A further object of the present invention is to provide a magnet for a magnetic brake from conductive loaded resin-based material.

A further object of the present invention is to provide a method to form magnetic brake components.

A further object of the present invention is to provide a magnetic brake components molded of conductive loaded resin-based materials.

A yet further object of the present invention is to provide magnetic brake components molded of conductive loaded resin-based material where electrical or thermal characteristics can be altered or the visual characteristics can be altered by forming a metal layer over the conductive loaded resin-based material.

A yet further object of the present invention is to provide a method to fabricate magnetic brake components from a conductive loaded resin-based material where the material is in the form of a fabric.

In accordance with the objects of this invention, a magnetic braking device is achieved. The device comprises a magnet and a conductive fin. The conductive fin moves through a magnetic field generated by the magnet to thereby generate a braking force on the conductive fin. The conductive fin comprises a conductive loaded, resin-based material comprising conductive materials in a base resin host.

Also in accordance with the objects of this invention, a magnetic braking device is achieved. The device comprises a magnet and a conductive fin. The conductive fin moves through a magnetic field generated by the magnet to thereby generate a braking force on the conductive fin. The conductive fin comprises a conductive loaded, resin-based material comprising conductive materials in a base resin host. The percent by weight of said conductive materials is between about 20% and about 50% of the total weight of the conductive loaded resin-based material.

Also in accordance with the objects of this invention, a magnetic braking device is achieved. The device comprises a magnet and a conductive fin. The conductive fin moves through a magnetic field generated by the magnet to thereby generate a braking force on the conductive fin. The conductive fin and the magnet comprise a conductive loaded, resin-based material comprising micron conductive fiber in a base resin host. The percent by weight of the conductive fiber is between about 20% and about 50% of the total weight of the conductive loaded resin-based material.

Also in accordance with the objects of this invention, a method to form a magnetic braking device is achieved. The method comprises providing a magnet and a conductive loaded, resin-based material comprising conductive materials in a resin-based host. The conductive loaded, resin-based material is molded into a conductive fin. The conductive fin is fixably arranged such that movement of the conductive fin through a magnetic field generated by the magnet generates a braking force on the conductive fin.

Also in accordance with the objects of this invention, a method to form a magnetic braking device is achieved. The method comprises providing a magnet and a conductive loaded, resin-based material comprising conductive materials in a resin-based host. The percent by weight of the conductive materials is between 20% and 50% of the total weight of the conductive loaded resin-based material. The conductive loaded, resin-based material is molded into a conductive fin. The conductive fin is fixably arranged such that movement of the conductive fin through a magnetic field generated by the magnet generates a braking force on the conductive fin.

Also in accordance with the objects of this invention, a method to form a magnetic braking device is achieved. The method comprises providing a first conductive loaded, resin-based material comprising conductive materials in a resin-based host. The conductive loaded, resin-based material is molded into a conductive fin. A second conductive loaded, resin-based material comprising conductive materials in a resin-based host is provided. The conductive loaded, resin-based material is molded into a conductive fin. The second conductive loaded, resin-based material is molded into a magnet. The conductive fin is fixably arranged such that movement of the conductive fin through a magnetic field generated by the magnet generates a braking force on the conductive fin.

BRIEF DESCRIPTION OF THE DRAWINGS

In the accompanying drawings forming a material part of this description, there is shown:

FIGS. 5a and 5b illustrate a fourth preferred embodiment wherein conductive fabric-like materials are formed from the conductive loaded resin-based material.

FIGS. 6a and 6b illustrate, in simplified schematic form, an injection molding apparatus and an extrusion molding apparatus that may be used to mold magnetic brake components of a conductive loaded resin-based material.

FIGS. 7a, 7b, and 7c illustrate a second preferred embodiment of the present invention showing a rotor-caliper magnetic braking system for a vehicle comprising the conductive loaded resin-based material according to the present invention.

DESCRIPTION OF THE PREFERRED EMBODIMENTS

Figure 1A:
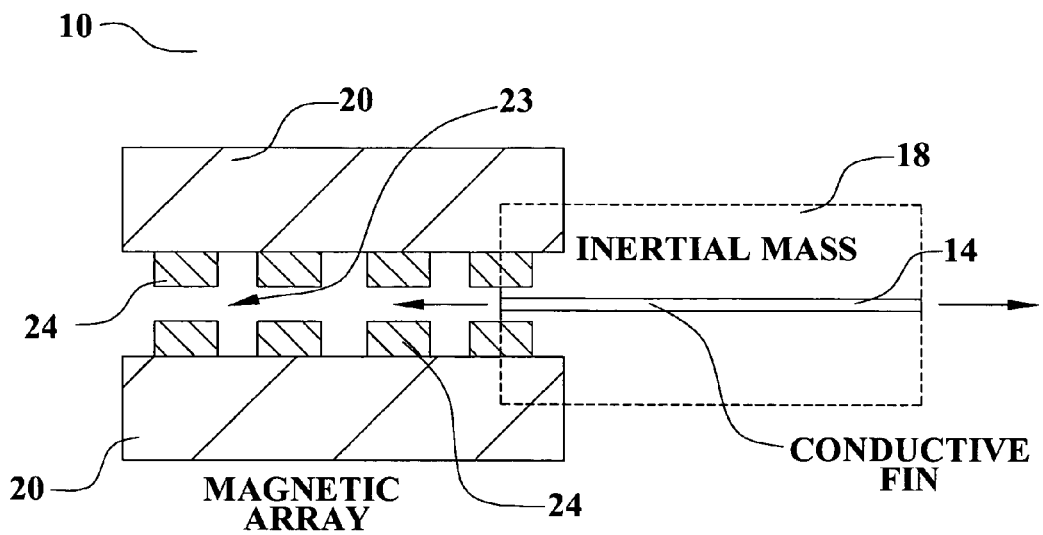
FIGS. 1a and 1b illustrate a first preferred embodiment of the present invention showing a magnetic brake system comprising conductive loaded resin-based material according to the present invention.

This invention relates to magnetic brake components molded of conductive loaded resin-based materials comprising micron conductive powders, micron conductive fibers, or a combination thereof, substantially homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are substantially homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of magnetic brake components fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the magnetic brake components are substantially homogenized together using molding techniques and or methods such as injection molding, over-molding, insert molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

In the conductive loaded resin-based material, electrons travel from point to point when under stress, following the path of least resistance. Most resin-based materials are insulators and represent a high resistance to electron passage. The doping of the conductive loading into the resin-based material alters the inherent resistance of the polymers. At a threshold concentration of conductive loading, the resistance through the combined mass is lowered enough to allow electron movement. Speed of electron movement depends on conductive loading concentration, that is, the separation between the conductive loading particles. Increasing conductive loading content reduces interparticle separation distance, and, at a critical distance known as the percolation point, resistance decreases dramatically and electrons move rapidly.

Resistivity is a material property that depends on the atomic bonding and on the microstructure of the material. The atomic microstructure material properties within the conductive loaded resin-based material are altered when molded into a structure. A substantially homogenized conductive microstructure of delocalized valance electrons is created. This microstructure provides sufficient charge carriers within the molded matrix structure. As a result, a low density, low resistivity, lightweight, durable, resin based polymer microstructure material is achieved. This material exhibits conductivity comparable to that of highly conductive metals such as silver, copper or aluminum, while maintaining the superior structural characteristics found in many plastics and rubbers or other structural resin based materials.

The use of conductive loaded resin-based materials in the fabrication of magnetic brake components significantly lowers the cost of materials and the design and manufacturing processes used to hold ease of close tolerances, by forming these materials into desired shapes and sizes. The magnetic brake components can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are substantially homogenized together within the base resin, during the molding process, yielding an easy to produce low cost, electrically conductive, close tolerance manufactured part or circuit. The resulting molded article comprises a three dimensional, continuous network of conductive loading and polymer matrix. The micron conductive powders can be of carbons, graphites, amines or the like, and/or of metal powders such as nickel, copper, silver, aluminum, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers may be metal fiber or metal plated fiber. Further, the metal plated fiber may be formed by metal plating onto a metal fiber or metal plating onto a non-metal fiber. Exemplary micron conductive fibers include nickel plated carbon fiber, stainless steel fiber, copper fiber, silver fiber, aluminum fiber, or the like, or combinations thereof. Metal plating for fiber include copper, nickel, cobalt, silver, gold, palladium, platinum, ruthenium, and rhodium, and alloys of thereof. Non-metal fiber cores include carbon, graphite, polyester, and other synthetic materials. Superconductor metals, such as titanium, nickel, niobium, and zirconium, and alloys of titanium, nickel, niobium, and zirconium may also be used as micron conductive fibers in the present invention. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the magnetic brake components. The doping composition and directionality associated with the micron conductors within the loaded base resins can affect the electrical and structural characteristics of the magnetic brake components and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming magnetic brake components that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in magnetic brake component applications as described herein.

The substantially homogeneous mixing of micron conductive fiber and/or micron conductive powder and base resin described in the present invention may also be described as doping. That is, the substantially homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the substantially homogeneous mixing of micron conductive fiber and/or micron conductive powder into a base resin.

As an additional and important feature of the present invention, the molded conductor loaded resin-based material exhibits excellent thermal dissipation characteristics. Therefore, magnetic brake components manufactured from the molded conductor loaded resin-based material can provide added thermal dissipation capabilities to the application. For example, heat can be dissipated from electrical devices physically and/or electrically connected to a magnetic brake component of the present invention.

As a significant advantage of the present invention, magnetic brake components constructed of the conductive loaded resin-based material can be easily interfaced to an electrical circuit or grounded. In one embodiment, a wire can be attached to a conductive loaded resin-based magnetic brake component via a screw that is fastened to the components. For example, a simple sheet-metal type, self tapping screw, when fastened to the material, can achieve excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw that is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made. For example, if the metal layer is solderable, then a soldered connection may be made between the magnetic brake components and a grounding wire.

A typical metal deposition process for forming a metal layer onto the conductive loaded resin-based material is vacuum metallization. Vacuum metallization is the process where a metal layer, such as aluminum, is deposited on the conductive loaded resin-based material inside a vacuum chamber. In a metallic painting process, metal particles, such as silver, copper, or nickel, or the like, are dispersed in an acrylic, vinyl, epoxy, or urethane binder. Most resin-based materials accept and hold paint well, and automatic spraying systems apply coating with consistency. In addition, the excellent conductivity of the conductive loaded resin-based material of the present invention facilitates the use of extremely efficient, electrostatic painting techniques.

The conductive loaded resin-based material can be contacted in any of several ways. In one embodiment, a pin is embedded into the conductive loaded resin-based material by insert molding, ultrasonic welding, pressing, or other means. A connection with a metal wire can easily be made to this pin and results in excellent contact to the conductive loaded resin-based material. In another embodiment, a hole is formed in to the conductive loaded resin-based material either during the molding process or by a subsequent process step such as drilling, punching, or the like. A pin is then placed into the hole and is then ultrasonically welded to form a permanent mechanical and electrical contact. In yet another embodiment, a pin or a wire is soldered to the conductive loaded resin-based material. In this case, a hole is formed in the conductive loaded resin-based material either during the molding operation or by drilling, stamping, punching, or the like. A solderable layer is then formed in the hole. The solderable layer is preferably formed by metal plating. A conductor is placed into the hole and then mechanically and electrically bonded by point, wave, or reflow soldering.

Another method to provide connectivity to the conductive loaded resin-based material is through the application of a solderable ink film to the surface. One exemplary solderable ink is a combination of copper and solder particles in an epoxy resin binder. The resulting mixture is an active, screen-printable and dispensable material. During curing, the solder reflows to coat and to connect the copper particles and to thereby form a cured surface that is directly solderable without the need for additional plating or other processing steps. Any solderable material may then be mechanically and/or electrically attached, via soldering, to the conductive loaded resin-based material at the location of the applied solderable ink. Many other types of solderable inks can be used to provide this solderable surface onto the conductive loaded resin-based material of the present invention. Another exemplary embodiment of a solderable ink is a mixture of one or more metal powder systems with a reactive organic medium. This type of ink material is converted to solderable pure metal during a low temperature cure without any organic binders or alloying elements.

A ferromagnetic conductive loaded resin-based material may be formed of the present invention to create a magnetic, or magnetizable, form of the material. Ferromagnetic micron conductive fibers and/or ferromagnetic conductive powders are mixed with the base resin. Ferrite materials and/or rare earth magnetic materials are added as a conductive loading to the base resin. With the substantially homogeneous mixing of the ferromagnetic micron conductive fibers and/or micron conductive powders, the ferromagnetic conductive loaded resin-based material is able to produce an excellent low cost, low weight magnetize-able item. The magnets and magnetic devices of the present invention can be magnetized during or after the molding process. The magnetic strength of the magnets and magnetic devices can be varied by adjusting the amount of ferromagnetic micron conductive fibers and/or ferromagnetic micron conductive powders that are incorporated with the base resin. By increasing the amount of the ferromagnetic doping, the strength of the magnet or magnetic devices is increased. The substantially homogenous mixing of the conductive fiber network allows for a substantial amount of fiber to be added to the base resin without causing the structural integrity of the item to decline. The ferromagnetic conductive loaded resin-based magnets display the excellent physical properties of the base resin, including flexibility, moldability, strength, and resistance to environmental corrosion, along with excellent magnetic ability. In addition, the unique ferromagnetic conductive loaded resin-based material facilitates formation of items that exhibit excellent thermal and electrical conductivity as well as magnetism.

A high aspect ratio magnet is easily achieved through the use of ferromagnetic conductive micron fiber or through the combination of ferromagnetic micron powder with conductive micron fiber. The use of micron conductive fiber allows for molding articles with a high aspect ratio of conductive fiber to cross sectional area. If a ferromagnetic micron fiber is used, then this high aspect ratio translates into a high quality magnetic article. Alternatively, if a ferromagnetic micron powder is combined with micron conductive fiber, then the magnetic effect of the powder is effectively spread throughout the molded article via the network of conductive fiber such that an effective high aspect ratio molded magnetic article is achieved. The ferromagnetic conductive loaded resin-based material may be magnetized, after molding, by exposing the molded article to a strong magnetic field. Alternatively, a strong magnetic field may be used to magnetize the ferromagnetic conductive loaded resin-based material during the molding process.

Exemplary ferromagnetic conductive fiber materials include ferrite, or ceramic, materials as nickel zinc, manganese zinc, and combinations of iron, boron, and strontium, and the like. In addition, rare earth elements, such as neodymium and samarium, typified by neodymium-iron-boron, samarium-cobalt, and the like, are useful ferromagnetic conductive fiber materials. Exemplary non-ferromagnetic conductor fibers include stainless steel, nickel, copper, silver, aluminum, or other suitable metals or conductive fibers, alloys, plated materials, or combinations thereof. Superconductor metals, such as titanium, nickel, niobium, and zirconium, and alloys of titanium, nickel, niobium, and zirconium may also be used as micron conductive fibers in the present invention. Exemplary ferromagnetic micron powder leached onto the conductive fibers include ferrite, or ceramic, materials as nickel zinc, manganese zinc, and combinations of iron, boron, and strontium, and the like. In addition, rare earth elements, such as neodymium and samarium, typified by neodymium-iron-boron, samarium-cobalt, and the like, are useful ferromagnetic conductive powder materials.

Figure 1B:
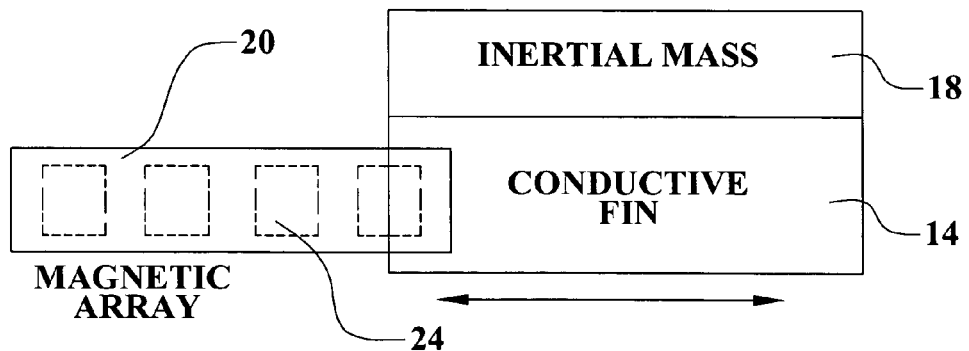

Referring now to FIGS. 1a and 1b a preferred embodiment of a magnetic brake 10 manufactured from conductive loaded resin-based material is illustrated. In particular, a very low cost magnetic brake or motion control mechanism 10 is created. Several important features of the present invention are shown and discussed below. A first preferred embodiment of the present invention shows a magnetic brake system 10. The magnetic brake 10 comprises a magnetic array 20 and 24 and an electrically conductive plate or fin 14. The magnetic array 20 and 24 in this example comprises a plurality of magnets 24 mounted onto parallel structures 20 such that a gap 23 remains between each array of magnets. The conductive fin 14 is fixably connected to an inertial mass 18. The magnetic brake system 10 is configured such that the conductive fin 14 can freely travel in the gap 23 between the magnetic arrays 20 and 24.

The inertial mass 18 can be any moving mass. The inertial mass can be a large object, such as a roller coaster car or an elevator, or a small object, such as fixture or pallet of a manufacturing line. As the conductive fin or plate 14 travels through the gap 23 of the magnetic array, the fin 14 crosses through strong magnetic field lines. As a result, eddy currents are generated in the conductive fin 14. These eddy currents, in conjunction with the magnetic field, produce a force that opposes the directional force of the plate. The result is a braking action on the plate 14 and on the attached inertial mass 18. The amount of braking force is proportional to the velocity of the conductive fin 14 traversing the magnetic gap 23. The greater the velocity, the greater the braking force. The lesser the velocity, the lesser the braking force. The magnetic braking system 10 results in a smooth braking response that does not require frictional components or a power source. Since the braking force is only exhibiting during relative motion between the conductive fin 14 and the magnetic array 20 and 24, the exit velocity of the inertial mass 18 and fin 14 assembly from the magnetic array zone is never zero.

In the above configuration, the conductive fin 14 is mounted on the inertial mass 18, such as a vehicle or a pallet system. Conversely, the magnetic array 20 and 24 may be mounted on the vehicle mass 18 and the fin 14 may be stationary. The energy of the moving mass 18 is converted into heat in the conductive fin 14 due to the eddy current conduction. At high velocities, the eddy currents increase and thereby create a larger heating of the fin 14. However, since there is no frictional contact between the fin 14 and the magnets 24, there is no source of wear or requirement for maintenance. While the schematic of FIG. 1 illustrates a system with permanent magnets 24 on both sides of the conductive fin 14 path of travel, the magnetic braking system 10 may also be configured with the magnetic array on only a single side of the fin path.

In one embodiment of the present invention, the conductive fin 14 of the magnetic braking system comprises a conductive loaded resin-based material as described herein. By constructing the conductive fin 14 from a conductive loaded resin-based material, the cost of the fin or plate 14 is reduced when compared to, for example, an all metal construction. In addition, the conductive loaded resin-based material does not corrode and, therefore, does not require maintenance or replacement if used in difficult environmental conditions. Finally, the conductive loaded resin-based conductive fin or plate 14 can have a reduced weight when compared to an all-metal alternative and thereby improve the efficiency of the vehicle mass 18.

As an optional feature, a metal layer may be formed on the conductive loaded resin-based material after it has been molded. The metal layer alters the performance characteristics, such as strength, resistivity, appearance, and/or thermal dissipation capability, of the conductive loaded resin-based material in the conductive fin 14. The metal layer may be formed by plating or by coating. If the method of formation is metal plating, then the resin-based structural material of the conductive loaded, resin-based material is one that can be metal plated. There are very many of the polymer resins that can be plated with metal layers. The metal layer may be formed by, for example, electroplating or physical vapor deposition.

In another embodiment of the present invention, the magnetic array 20 and 24 comprises the conductive loaded resin-based material where a ferromagnetic material, as described above, is added to the conductive loading. As a result, a magnetic or magnetizable conductive loaded resin-based material is realized. This material is preferably magnetized during the molding process such that a permanent magnet is generated. The permanent magnets 24 of the magnetic array are thereby generated of the conductive loaded resin-based material. The resulting magnets 24 are lower in weight than typical permanent magnets, are less brittle than typical magnets, and are not subject to corrosion.

Referring now to FIGS. 7a, 7b, and 7c, a second preferred embodiment of the present invention is illustrated. In this case, a rotor-caliper braking system 100 a shown. Rotor-caliper braking systems are used to provide braking for vehicles such as automobiles and/or trucks. In this scenario, each vehicle wheel, not shown, is attached to a hub 112 using the bolts 116 in the hub 112. The hub 112 is further connected to the vehicle as is well-known in the art. In the preferred embodiment, a rotor 104 is further connected to the hub 112 such that the rotor 104 will spin when the hub 112 spins. In one embodiment, the rotor 104 serves the same role as the conductive fin 14 as depicted in FIGS. 1a and 1b. Referring again to FIGS. 7a and 7b, this rotor 104 comprises the conductive loaded resin-based material according to the present invention. In another preferred embodiment, a caliper mechanism 108 serves the role of the array of magnets 24 depicted in FIGS. 1a and 1b. Referring again to FIGS. 7a and 7b, the caliper 108 preferably comprises an array of permanent magnets 124 formed from the conductive loaded resin-based material loaded with ferromagnetic conductive loading and permanently magnetized as described above. In yet another embodiment, the main mass 120 of the caliper mechanism 108 comprises the conductive loaded resin-based material of the present invention.

When the brake 100 is not actuated, or is not active, the caliper mechanism 108 is spaced 140 from the rotor 104 such that the magnetic field due to the embedded to permanent magnets 124 is too weak to create eddy currents in the rotor 104. Therefore, the caliper mechanism 108 does not cause a braking force on the rotor 104. However, when the brake 100 is actuated, or is made active, the caliper mechanism 108 is forced toward the rotor 104. The smaller spacing between the caliper mechanism 108 and the rotor 104 allows a substantially larger magnetic field strength from the embedded permanent magnets 124 to interact with the rotor 104. This magnetic field interaction, and the relative motion between the caliper mechanism 108 and the rotor 104, creates Eddy currents in the rotor 104. Once again, these Eddy currents, in conjunction with the magnetic field, produce a stopping force on the rotor 104 and on the connected hub 112. The kinetic energy of the moving vehicle is thereby converted to heat energy in the rotor 104. This braking force is realized without brake pads.

The embedded magnets 124 may comprise any permanent magnetic material. For example, neodymium is well-known as a permanent magnetic material 124 and can simply be embedded in the conductive loaded resin-based material of the caliper mechanism 108. Alternatively, the permanent magnets 124 comprise the conductive loaded resin-based material loaded with a ferromagnetic material and magnetized. Preferably, the conductive loaded resin-based material of the vehicle braking system 100 comprises a based resin with a very high melting temperature. In addition, to dissipate the heat of braking, the rotor 104 may further comprise fins 128 or other heat transfer enhancing structures. While the rotor and caliper based magnetic brake of this embodiment illustrates a single caliper from a single side, further embodiments may include multiple calipers, caliper pairs, and calipers approaching the rotor from different sides. In addition, the polarities (north and south) of the magnets may be arranged to create useful magnetic polarity combinations between opposing calipers. For example, calipers on opposite sides of a rotor may be constructed such that opposing embedded magnetic inserts have opposite polarity to maximize the magnetic field.

Figure 8:
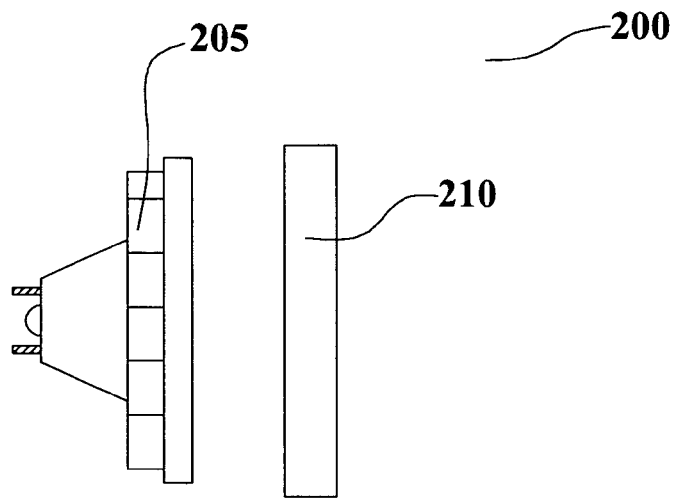
FIG. 8 illustrates a third preferred embodiment of the present invention showing a rotor-caliper magnetic braking system where the caliper is magnetic and/or the rotor is magnetic and comprising the ferromagnetic conductive loaded resin-based material.

Referring now to FIG. 8, a third preferred of the present invention is illustrated. Another rotor-caliper embodiment 200 is shown. In this embodiment, the rotor 205 and/or the caliper 210 comprises a ferromagnetic loaded conductive loaded resin-based material. The ferromagnetic loaded material is then magnetized during or after a molding operation. A magnetized rotor 205 and/or caliper 210 are thereby formed. When the caliper 210 is forced into near proximity with the rotor 205, the presence of the magnetic field due to each brake section creates an Eddy current effect in the other section to thereby generate an enhanced braking effect.

Another important application of the present invention is motion control of automated equipment and machinery. For example the novel magnetic brake comprising conductive loaded resin-based material may be applied to speed control on a high-speed electric motor. The magnetic brake provides rapid deceleration of the electric motor shaft without applying undue wear and/or torque on the motor. Computers numerical control (CNC) machines require rapid acceleration/deceleration and changing direction. The magnetic brake or motion control system of the present invention provides smooth deceleration for rapid and controlled directional change.

Figure 9:
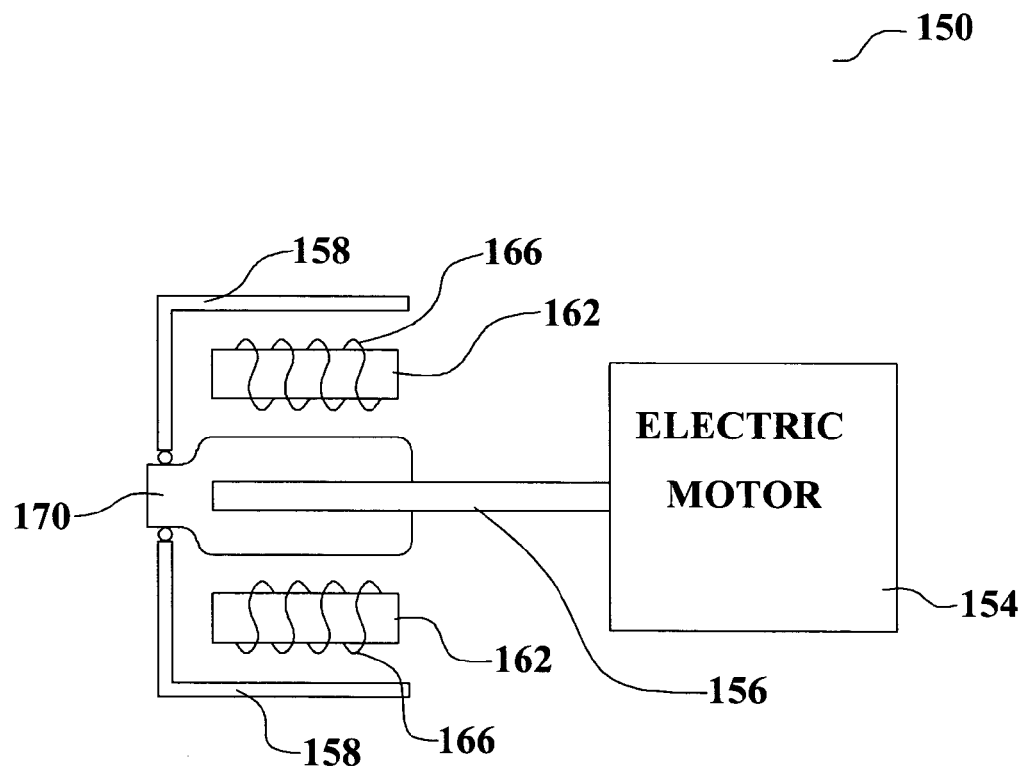
FIG. 9 illustrates a fourth preferred embodiment of the present invention showing an electromagnetic braking system comprising the conductive loaded resin-based material according to the present invention.

Referring now to FIG. 9, a motion control braking system 150 for an electric motor 154 is shown as a fourth preferred embodiment of the present invention. The electric motor 154 drives a shaft 156 to which is connected, directly or indirectly, an operating load, not shown. In this embodiment, an electromagnetic braking system 150 is used. An electromagnetic braking system works in similar fashion as the permanent magnetic systems previously described except that the magnetic force is turned OFF and ON based on the flow of current through a conductor coiled onto a magnet core. In the illustrated embodiment, a magnet core 162, or series of cores 162, is placed in the perimeter of the controller inside a case 158. A conductor 166 is wound onto each core 162 such that current flow will create a magnetic field between the cores 162. The shaft 156 of the electric motor 154 is held in a chuck 170 of the controller. This chuck 170 is held in the case 158 such that the chuck can spin freely. For example, the chuck 170 has ball bearings between the chuck 170 and the case 158 to reduce friction. The chuck is made of a conductive material.

The controller has two modes of operation. In one mode, no current is flowing through the electromagnet winding 166 such that no magnetic field is generated. As a result, the controller adds very little drag to the spinning shaft 156 of the electric motor 154. In the second mode, electric current is directed through the winding 166 such that a magnetic field is developed. If the shaft 156 is spinning, then the conductive chuck 170 is also spinning. The magnetic field generated by the electromagnetic winding 166 and core 162 creates an Eddy current in the spinning chuck 170. This Eddy current, in turn, generates an electromagnetic force (EMF) that resists this turning. Therefore, the energized controller creates a large drag on the motor shaft 156 that allows the motor to rapidly stop. This rapid stopping ability is very useful for motor applications, such as CNC machines, that demand very accurate movements.

In one embodiment, the conductive chuck 170 comprises the conductive loaded resin-based material of the present invention. The conductive loaded resin-based material combines high electrical and thermal conductivity to allow the chuck 170 to sustain high Eddy currents and to dissipate significant energy. In another embodiment, the core 162 of the electromagnet comprises the conductive loaded resin-based material. The conductive loaded resin-based material can be made magnetizable and/or magnetic by incorporating ferromagnetic material into the conductive loading. In yet another embodiment, the conductive winding 166 comprises the conductive loaded resin-based material of the present invention. In yet another embodiment, the case 158 of the controller comprises the conductive loaded resin-based material.

Figure 2:
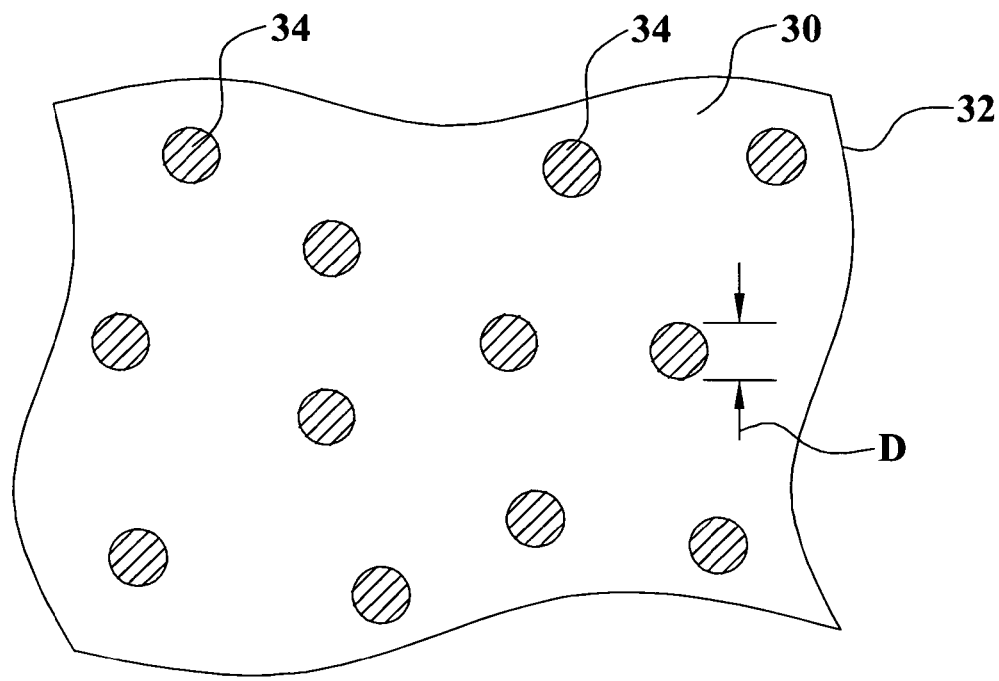
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) substantially homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
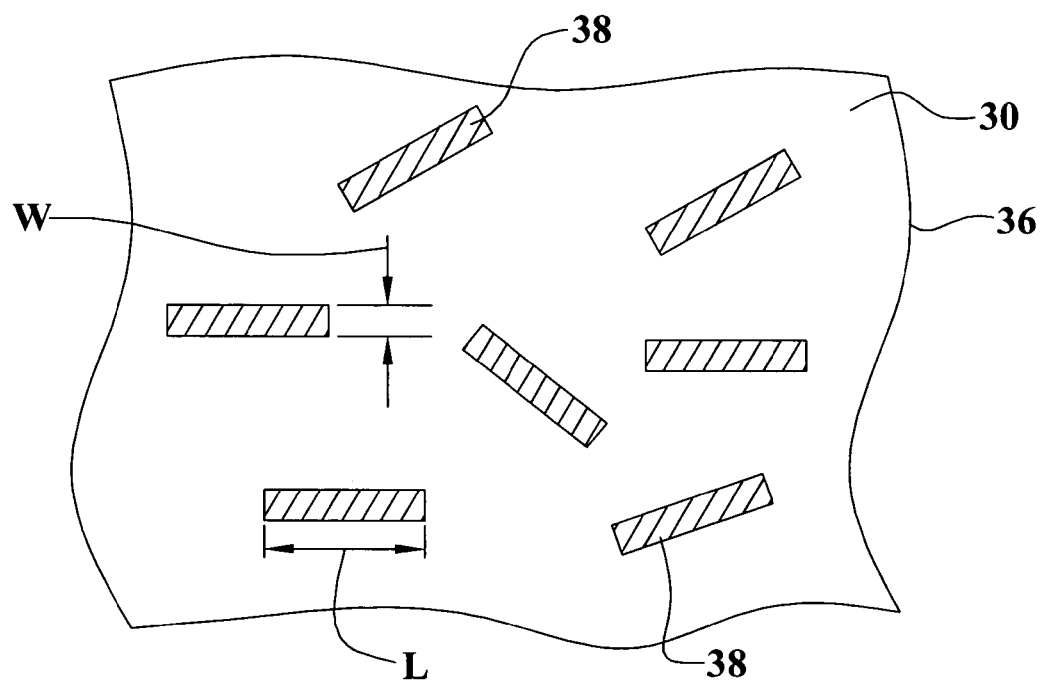
FIG. 3 illustrates a second preferred embodiment of a conductive loaded resin-based material wherein the conductive materials comprise micron conductive fibers.
Figure 4:
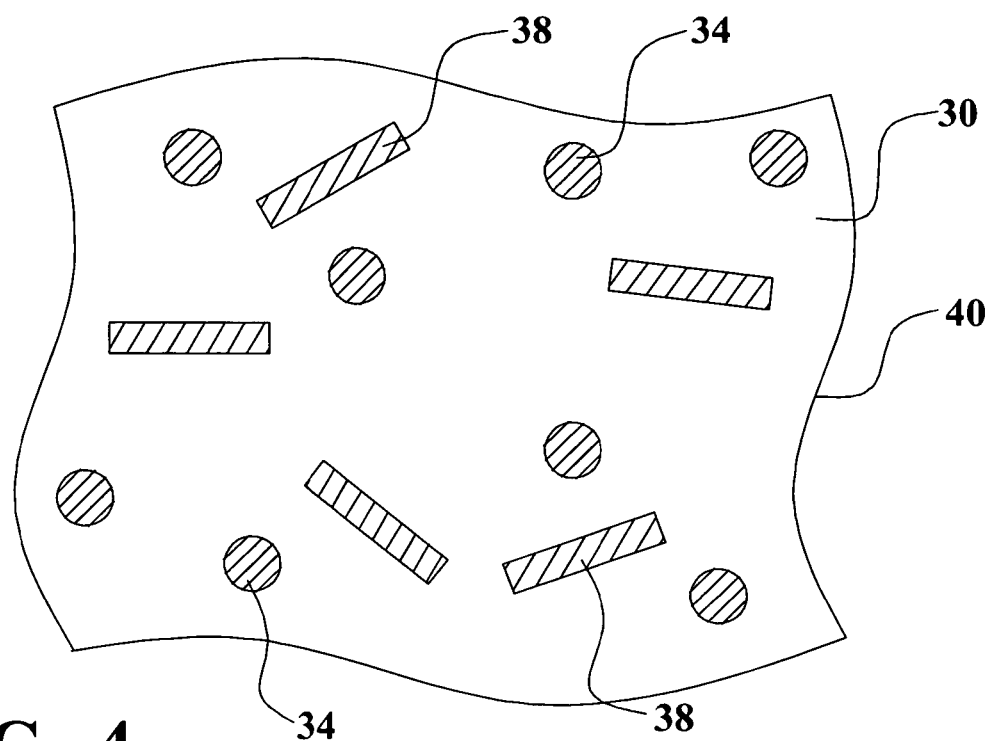
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, aluminum, or other suitable metals or conductive fibers, or combinations thereof. Superconductor metals, such as titanium, nickel, niobium, and zirconium, and alloys of titanium, nickel, niobium, and zirconium may also be used as micron conductive fibers in the present invention. These conductor particles and or fibers are substantially homogenized within a base resin. As previously mentioned, the conductive loaded resin-based materials have a sheet resistance between about 5 and 25 ohms per square, though other values can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 6-12 micron in diameter and lengths of 4-6 mm and comprising, by weight, about 30% of the total weight of the conductive loaded resin-based material will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 substantially homogenized together within the resin base 30 during a molding process.

Figure 5A:
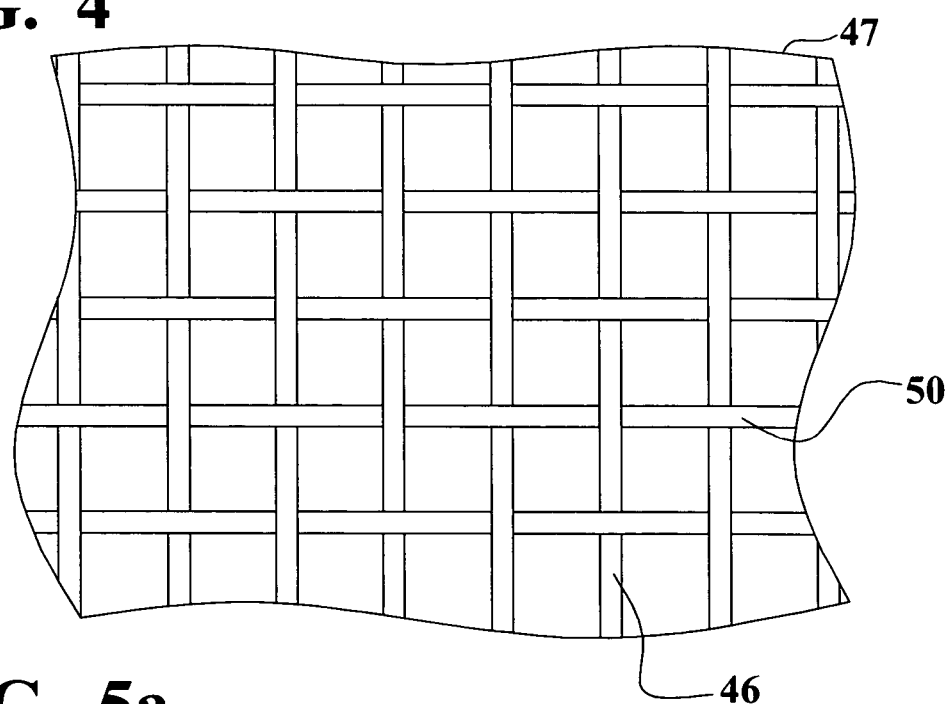

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Magnetic brake components formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the substantially homogenized conductive material cures by thermal reaction. The upper portion 58 and lower portion 54 of the mold are then separated or parted and the magnetic brake components are removed.

FIG. 6b shows a simplified schematic diagram of an extruder 70 for forming magnetic brake components using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. Effective magnetic brake components are achieved. A conductive fin is formed for a magnetic brake from conductive loaded resin-based material. A magnet for a magnetic brake is formed from conductive loaded resin-based material. Methods to form magnetic brake components are achieved. Magnetic brake components are molded of conductive loaded resin-based materials. Electrical or thermal characteristics are altered or the visual characteristics are altered by forming a metal layer over the conductive loaded resin-based material. Magnetic brake components are molded from conductive loaded resin-based material where the material is in the form of a fabric.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A magnetic braking device comprising:
   a magnet; and
   a conductive fin wherein said conductive fin moves through a magnetic field generated by said magnet to generate an eddy current in said conductive fin and to thereby generate a braking force on said conductive fin wherein said conductive fin comprises a conductive loaded, resin-based material comprising micron conductive fiber in a base resin host.

2. The device according to claim 1 wherein said magnet comprises a conductive loaded, resin-based material comprising micron conductive fiber in a base resin host.

3. The device according to claim 2 wherein said micron conductive fiber comprise ferromagnetic materials.

4. The device according to claim 2 wherein said magnet further comprises a conductor wound on said magnet to form an electromagnet.

5. The device according to claim 1 wherein said micron conductive fiber are metal.

6. The device according to claim 1 wherein said micron conductive fiber are non-conductive materials with metal plating.

7. The device according to claim 1 wherein said conductive fin is metal plated.

8. The device according to claim 1 wherein the percent by weight of said micron conductive fiber is between about 20% and about 50% of the total weight of said conductive loaded resin-based material.

9. The device according to claim 1 wherein said conductive loaded resin-based material further comprises micron conductive powder.

10. A magnetic braking device comprising:
    a magnet; and
    a conductive fin wherein said conductive fin moves through a magnetic field generated by said magnet to generate an eddy current in said conductive fin and to thereby generate a braking force on said conductive fin, wherein said conductive fin comprises a conductive loaded, resin-based material comprising micron conductive fiber in a base resin host, and wherein the percent by weight of said micron conductive fiber is between 20% and 50% of the total weight of said conductive loaded resin-based material.

11. The device according to claim 10 wherein said magnet comprises a conductive loaded, resin-based material comprising micron conductive fiber in a base resin host.

12. The device according to claim 11 wherein said micron conductive fiber comprise ferromagnetic materials.

13. The device according to claim 11 wherein said magnet further comprises a conductor wound on said magnet to form an electromagnet.

14. The device according to claim 10 wherein said conductive loaded resin-based material further comprises micron conductive powder.

15. The device according to claim 14 wherein said conductive powder is nickel, copper, or silver.

16. The device according to claim 14 wherein said conductive powder is a non-conductive material with a metal plating of nickel, copper, silver, or alloys thereof.

17. The device according to claim 10 wherein said micron conductive fiber are nickel plated carbon micron fiber, stainless steel micron fiber, copper micron fiber, silver micron fiber or combinations thereof.

18. The device according to claim 10 wherein said conductive fin is metal plated.

19. A magnetic braking device comprising:
a magnet; and
a conductive fin wherein said conductive fin moves through a magnetic field generated by said magnet to generate an eddy current in said conductive fin and to thereby generate a braking force on said conductive fin, wherein both said conductive fin and said magnet comprise a conductive loaded, resin-based material comprising micron conductive fiber in a base resin host wherein the percent by weight of said conductive fiber is between 20% and 50% of the total weight of said conductive loaded resin-based material.

20. The device according to claim 19 wherein said micron conductive fiber is stainless steel.

21. The device according to claim 20 further comprising conductive powder.

22. The device according to claim 20 wherein said micron conductive fiber has a diameter of between about 3 μm and about 12 μm and a length of between about 2 mm and about 14 mm.

23. The device according to claim 19 wherein said micron conductive fiber of said magnet comprises ferromagnetic material.

24. The device according to claim 19 wherein said magnet further comprises a conductor wound on said magnet to form an electromagnet.

\* \* \* \* \*